(12) United States Patent
Lerner et al.

(10) Patent No.: US 7,517,813 B2
(45) Date of Patent: Apr. 14, 2009

(54) TWO-STEP OXIDATION PROCESS FOR SEMICONDUCTOR WAFERS

(75) Inventors: Ralf Lerner, Erfurt (DE); Uwe Eckoldt, Hohenfelden (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 0 days.

(21) Appl. No.: 11/576,078

(22) PCT Filed: Oct. 6, 2005

(86) PCT No.: PCT/DE2005/001790

§ 371 (c)(1),
(2), (4) Date: Aug. 22, 2007

(87) PCT Pub. No.: WO2006/037317

PCT Pub. Date: Apr. 13, 2006

(65) Prior Publication Data

US 2008/0135985 A1 Jun. 12, 2008

(30) Foreign Application Priority Data

Oct. 6, 2004 (DE) ........................ 10 2004 048 626

(51) Int. Cl.
*H01L 21/31* (2006.01)
*H01L 21/469* (2006.01)

(52) U.S. Cl. .................. 438/770; 438/5; 257/E21.552; 257/E21.703; 257/632

(58) Field of Classification Search ................. 438/439, 438/770, 938, 928, 448, 5, 452, 197; 257/647, 257/E21.34, E21.552, E23.002, E27.112, 257/E21.703, E21.55, E21.642, 632
See application file for complete search history.

(56) References Cited

U.S. PATENT DOCUMENTS

| 5,466,631 A | 11/1995 | Ichikawa et al. ............... 437/62 |
| 5,599,722 A | 2/1997 | Sugisaka et al. ............... 437/21 |
| 5,646,063 A | 7/1997 | Mehta et al. ................... 437/67 |
| 5,665,631 A | 9/1997 | Lee et al. ..................... 438/459 |
| 5,801,084 A | 9/1998 | Beasom et al. ................ 438/457 |
| 5,837,378 A | 11/1998 | Mathews et al. .............. 438/439 |
| 5,849,267 A | 12/1998 | Collins et al. ................. 424/49 |
| 5,856,230 A * | 1/1999 | Jang ........................... 438/439 |
| 2004/0063263 A1* | 4/2004 | Suzuki et al. ................ 438/197 |

* cited by examiner

*Primary Examiner*—Caridad M Everhart
(74) *Attorney, Agent, or Firm*—Duane Morris LLP

(57) ABSTRACT

An efficient method for the thermal oxidation of preferably silicon semiconductor wafers using LOCOS (local oxidation of silicon) processes is described. The mechanical stresses of the wafers are to be reduced. To this end, an oxidation method is proposed that comprises providing a substrate (1) having a front side (12) to be patterned and a rear side (13). The substrate is oxidized in two steps. In a first step the rear side (13) is covered by a layer (4) that inhibits or hampers the oxidation. During a second step of the oxidation the oxidation-hampering layer (4) is no longer present. During both steps an oxide thickness is obtained on the front side (12) that is greater than an oxide thickness obtained on the rear side (13).

19 Claims, 3 Drawing Sheets

TWO-STEP OXIDATION PROCESS FOR SEMICONDUCTOR WAFERS

FIELD OF THE INVENTION

The present invention relates to a thermal oxidation process for creating oxide layers patterned at one side of silicon wafers, in particular by using a LOCOS process, during which the resulting mechanical stresses of the processed semiconductor wafers are reduced by means of an appropriate process flow.

BACKGROUND

During the thermal oxidation of a silicon semiconductor wafer using the so-called LOCOS process (LOCal Oxidation of Silicon) first the semiconductor wafer is covered by a barrier layer, such as silicon nitride. The silicon nitride represents a barrier for the diffusion of oxygen so that the silicon nitride prevents oxidation of the lower lying silicon that may be considered as an example of a semiconductor substrate. At those areas at which an oxidation is to take place the nitride and hence the diffusion barrier is removed prior to the actual oxidation process (for instance, by means of a photolithography step followed by plasma etching). For forming the silicon nitride layer typically deposition processes using a gaseous ambient are used. For this purpose processes exist in which the layer deposition occurs on the front side only, while also processes are known in which the layer deposition is also performed on the rear side. Therefore, the rear side of silicon wafer is either also oxidized (no nitride on the rear side), or is not oxidized at all (rear side is covered by nitride).

Due to the different thermal extension of silicon dioxide relative to silicon the heating of the silicon semiconductor wafer causes mechanical stresses. If the oxide layers are not uniform on the front side and the rear side (for instance, with respect to the thickness or structure), in this case a different mechanical stress at the front side and the rear side is caused, thereby resulting in a disturbing bending of the wafer. Due to these mechanical stresses crystal defects may be generated. A similar situation occurs with respect to silicon nitride and silicon.

In order to avoid a bending of the semiconductor wafer U.S. Pat. No. 5,599,722 discloses to use identical layers on the front side and the rear side (identical thickness, symmetric arrangement). To this end, a LOCOS process is used in which the silicon nitride layer is removed from the rear side prior to the oxidation such that the polysilicon layer located below is also oxidized.

In U.S. Pat. No. 5,849,627 also the same layer thickness is used for the mask oxide, the buried oxide and rear side oxide so as to achieve a balance of the mechanical stresses for bonded wafers during thermal oxidation processes, that is, to reduce the bending of SOI wafers. After the patterning of the front side layer also in this case an imbalance between the front side and rear side is caused.

In U.S. Pat. No. 5,665,631 an SOI manufacturing process is disclosed in which the bending of an SOI wafer is to be corrected by varying the thickness of polysilicon layers ("material layer") additionally deposited on the rear side. This method, however, requires significant additional effort, since first the additional layer has to be deposited and subsequently this layer has to be removed from the front side.

U.S. Pat. No. 5,837,378 describes a method for avoiding the creation of crystal damage caused by mechanical stresses. For this purpose a LOCOS process is applied to the front side. The nitride layer and the base oxide located below are removed from the rear side. During the subsequent oxidation the front side and the rear side are oxidized. In a variant an additional polysilicon layer is deposited on the nitride layer at the rear side. During the oxidation this polysilicon layer is then oxidized. In both cases it is attempted to create the same thickness on the front side and rear side. The imbalance caused by the patterning of the oxide on the front side is not taken into consideration. When using additionally applied layers further process steps are required, thereby causing additional costs.

A very similar strategy is disclosed in U.S. Pat. No. 5,856,230. On the front side a LOCOS process is performed, on the rear side the nitride and the base oxide are removed prior to the oxidation. The oxidation occurs at the front side and the rear side. Due to the deposition of the rear side layer the mechanical stresses are counter-acted (mainly due to the nitride).

U.S. Pat. No. 5,466,631 discloses a manufacturing technique for SOI substrates, in which the problem of the wafer bending is solved by an appropriate rear side layer. To this end, among others, poly-crystalline silicon may be used that is oxidized or thinned, depending on requirements.

In U.S. Pat. No. 8,801,084 the bending of bonded semiconductor wafers is limited by using compensation, sacrificial and protection layers on the rear side; for example, a sacrificial layer comprised of poly-crystalline silicon is described. During oxidation this layer is "consumed"; the silicon oxide located below and compensating the mechanical stress is not attacked.

In all these publications additional layers are provided on the rear side, requiring additional effort. The patterning of the front side is not addressed. The rear side layer in the form of a non-patterned layer causes significantly higher stresses than the patterned front side layer. Even if the same oxide thickness is created on the front side and the rear side, an imbalance of the mechanical stress and a bending of the semiconductor wafer are caused, at least internal mechanical stresses acting in this way.

SUMMARY OF THE CLAIMED INVENTION

It is an object of the present invention to take into consideration the patterning of the front side layer with respect to the thickness of the rear side oxide created by the LOCOS process so as to achieve an enhanced stress balance.

The invention is an enhanced method for at least reducing the mechanical stresses induced by the layers located on the surface of process wafers. According to the present invention a reduction of the mechanical stresses may be achieved without additionally applied layers.

The object is solved by a LOCOS oxidation method comprising the steps: providing a substrate having a front side to be patterned and a rear side, oxidizing the substrate in two steps, wherein in a first step the rear side is covered by an oxidation-hampering layer, and in a second step the oxidation-hampering layer is removed such that an increased oxide thickness is created on the front side compared to the rear side during both steps (claims 1, 15).

In this way advantages are obtained in that a significantly more precise balancing of the oxide layers formed on the front side and the rear side with respect to their mechanical characteristics may be achieved. The resulting mechanical stresses are balanced in a more efficient manner or may be adjusted in a desired manner, thereby reducing, for instance, the resulting wafer bending. In this way the risk of creating crystal defects may be minimized. Furthermore, any additional layers are not deposited, thereby having a positive effect on the process costs. The additional etch step relative to the conventional LOCOS process is only a minor additional effort that is significantly less compared to the conventional process techniques.

In one embodiment the front side having an oxidation-hampering layer is patterned prior to oxidizing the substrate. In this case, the oxidation-hampering layer may be applied to both sides in a single process.

In a further embodiment the front side is patterned after the oxidation process. Hence, the patterning process may be performed without a thermal effect of the (first) oxidation.

In a further embodiment the method further comprises:
Determining a degree of oxide coverage for the front side to be patterned, and controlling the oxidation process on the basis of the determined degree of coverage.
In this way the difference in thickness may be determined very precisely prior to the actual patterning, thereby allowing an efficient process planning.
In a further embodiment the controlling of the oxidation process is performed by including the target thickness of the oxide on the front side to be patterned.

In a further embodiment controlling the oxidation process is performed such that substantially the same oxide volumes are created on the front side and the rear side. In this manner mechanical stresses may be balanced in a highly precise fashion (claim 6).

In a further embodiment the oxidation-hampering layer is applied to the rear side prior to the first step and is removed after the first step, i.e., prior to the second step (claim 7).

In a further embodiment the oxidation-hampering layer is applied to the rear side after the first step.

Due to these methods an enhanced flexibility may be achieved fort he process flow, wherein the availability of etch tools and deposition tools, respectively, may taken into consideration during the process.

In a further aspect (claim 11) the invention relates to a LOCOS oxidation method of silicon wafers for reducing mechanical stresses in a silicon wafer patterned at one side only, wherein the mechanical stresses are caused in a different manner on the front side and the rear side of the silicon wafer, wherein starting from a silicon wafer having a silicon nitride layer on both sides and wherein the nitride layer of one side is patterned and the nitride layer of a second side of the silicon wafer is non-patterned, the subsequent oxidation is performed in two steps. In this case the oxidation is interrupted after a time T1, during which an oxide layer of thickness D1 is grown on the first side, and the continuous nitride layer is removed from the second side. Moreover, the oxidation is continued in a second step, wherein in a time T2 the oxide layer is increased on the patterned side to a value D11, with D11<D10, while the times T1 and T2 are selected such that the volume of the oxide layer or layers having the thickness D10 of the first side is equal to the volume of the second oxide layer having the thickness D11 on the second side of the silicon substrate (that may be considered as a semiconductor substrate).

In a further aspect (claim 12) the invention relates to an oxidation method for reducing mechanical stresses caused by different layers on the front side and the rear side of a silicon wafer having a patterned oxide layer on a first wafer side, wherein starting from an oxidation inhibiting layer the subsequent oxidation process is performed in two steps on a second side of the silicon wafer. In this case in a first step the oxidation process is interrupted after a time T1 during which an oxide layer having a thickness D1 (first thickness) is grown on the first side of the silicon wafer, and the oxidation inhibiting layer is removed from the second side of the silicon wafer, and in second step the oxidation is continued, wherein in a second time T2 the oxide layer on the first side of the silicon wafer increases to the second thickness D2 or D11 and an oxide layer having a third thickness D3 or D11 is grown on the opposite (second) layer of the substrate, wherein D3<D2 and the times T1 and T2 are selected such that the volume of the patterned oxide layer or layers having the second thickness on the first side of the silicon wafer is equal to the volume of the oxide layer having the third thickness on the oppositely located side of the silicon wafer, and after the end of the oxidation the oxide layer of the first side of the silicon wafer is patterned.

Further embodiments are set forth in the respective dependent claims (that are included here) and in the following detailed description.

BRIEF DESCRIPTION OF THE DRAWINGS

The method will be described by way of embodiments using the drawings, in which:

FIG. 1 shows a silicon wafer having a patterned silicon nitride layer on the front side and a complete identical layer on the rear side, FIG. 2 depicts the wafer of FIG. 1 after a thermal oxidation, FIG. 3 illustrates the wafer of FIG. 2 after removal of the silicon nitride layers, FIG. 4 shows the silicon layer having a patterned oxide layer 2 on the front side 12 and a complete identical layer on the oppositely located rear side 13, FIG. 5 shows a silicon wafer having an oxide layer on both sides, FIG. 6 depicts the wafer of FIG. 5 after patterning the oxide layer on the front side 12, FIG. 7 illustrates the silicon wafer obtained after applying a first example of the inventive method after the first oxidation step, FIG. 8 depicts the wafer of FIG. 7 as obtained after the second oxidation step, also see FIG. 8a.

FIG. 1 illustrates an example of a silicon wafer 1 having a patterned silicon nitride layer 3 located on a front side 12 and having a continuous, i.e., a non-patterned silicon nitride layer 4 located on a rear side 13. The result of a thermal oxidation process of wafer 1 is shown in FIG. 2.

A thermal oxide 2 is grown at the areas of the semiconductor wafer 1 not covered by the front side nitride layer 3. In this case a certain lateral diffusion is created below (a so-called "bird's beak"). FIG. 3 illustrates the stage after the removal of the silicon nitride layer from the rear side 13. No further oxide is grown on the rear side 13 of the silicon wafer 1, on the front side 12 structures or patterns of silicon dioxide 2 are provided.

If on the other hand a deposition process on one side only is used (e.g., a specific CVD process) for the deposition of the silicon nitride layer, or if the nitride layer on the rear side 13 is removed prior to the thermal oxidation process, an oxide layer 5 also grows on the rear side 13, cf. FIG. 4. In this case, the thickness of the rear side oxide layer 5 corresponds to the thickness of the front side oxide patterns 2.

Figure 1:
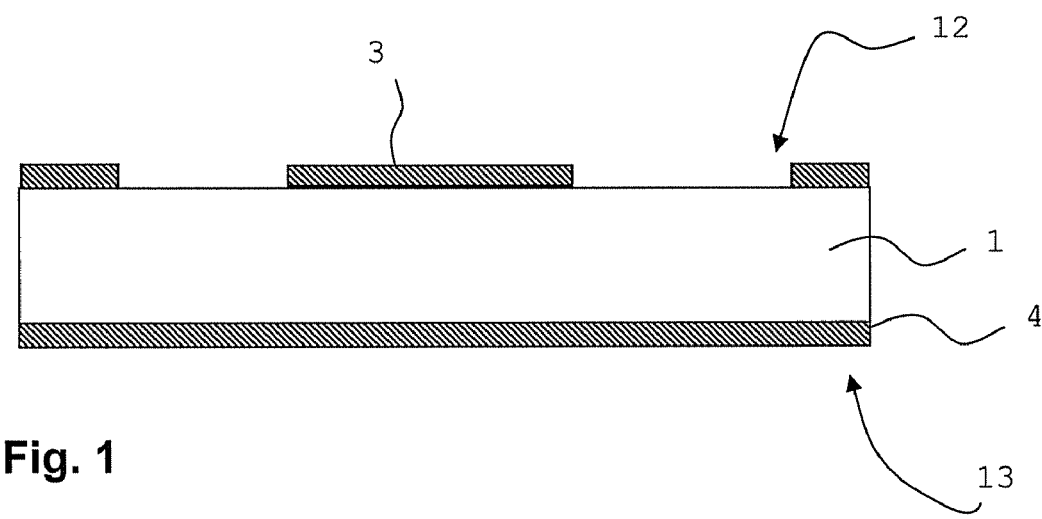
FIGS. 1 to 6 are schematic cross-sectional views of portions of semiconductor wafers during various steps for forming a LOCOS oxide area on a patterned front side according to conventional methods (the portion shown is sectioned at the left and right hand sides)
Figure 2:
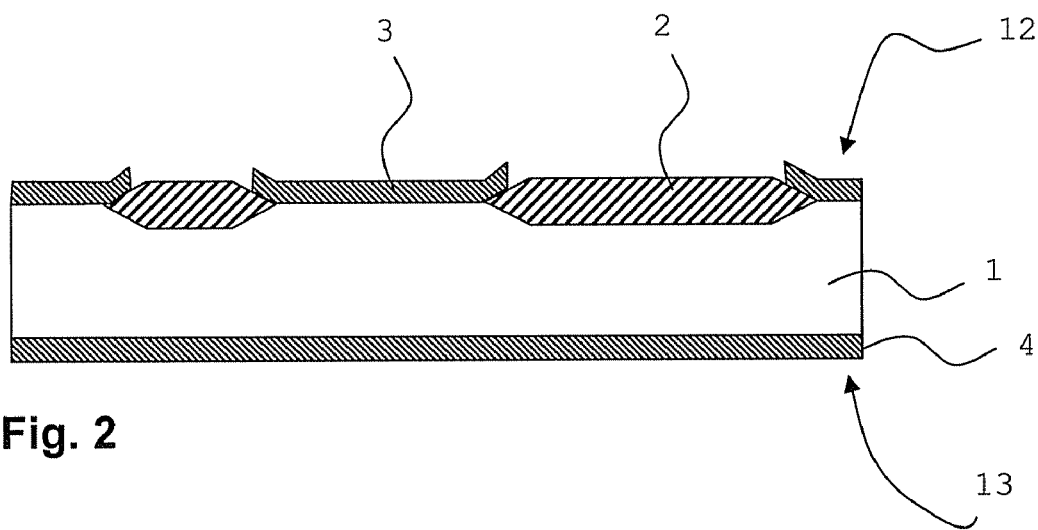
Figure 3:
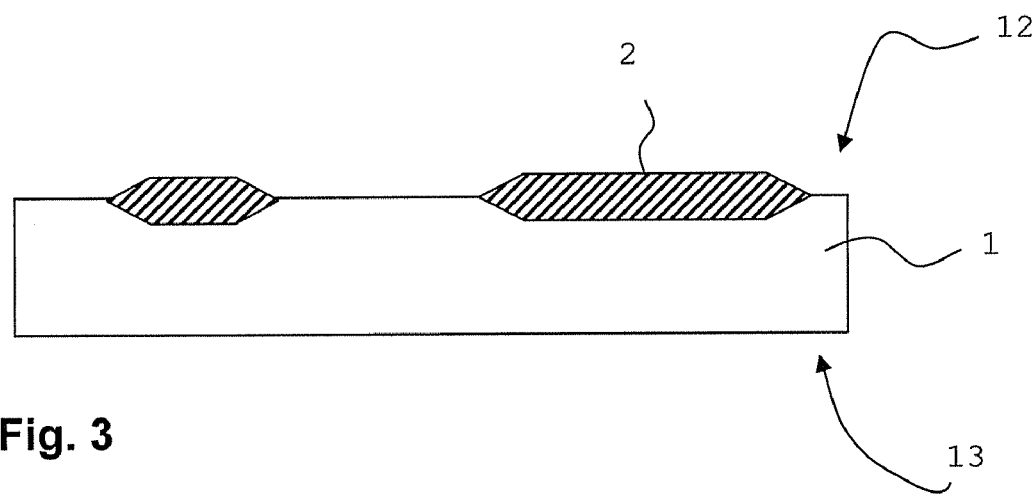
Figure 4:
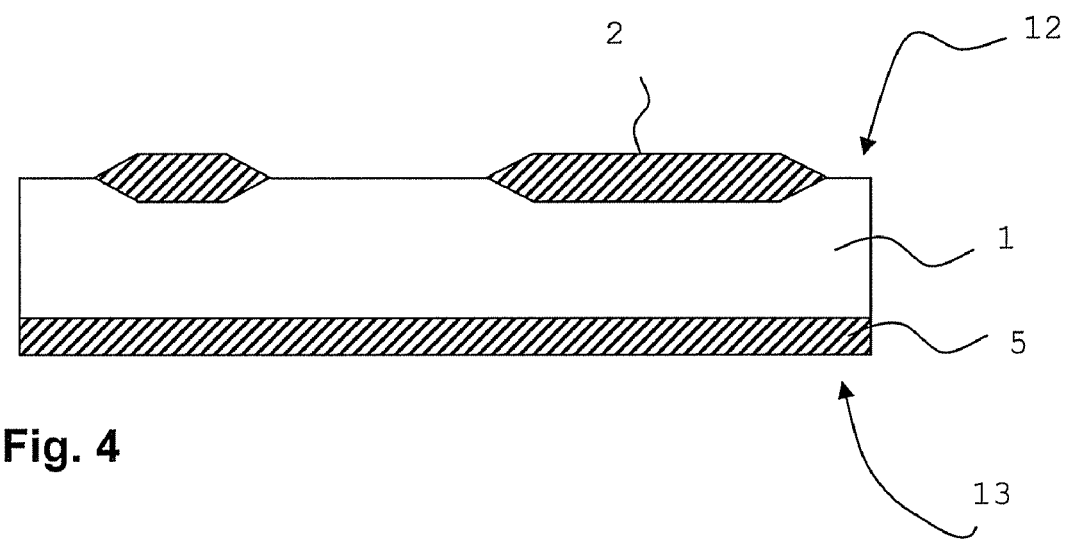

In both cases shown in FIGS. 3 and 4 patterned oxide surfaces 2 are provided on the front side 12 and no or a continuous or closed oxide layer 11 is provided on the rear side 13. The front side 12 and the rear side 13 have a different layer structure.

Figure 5:
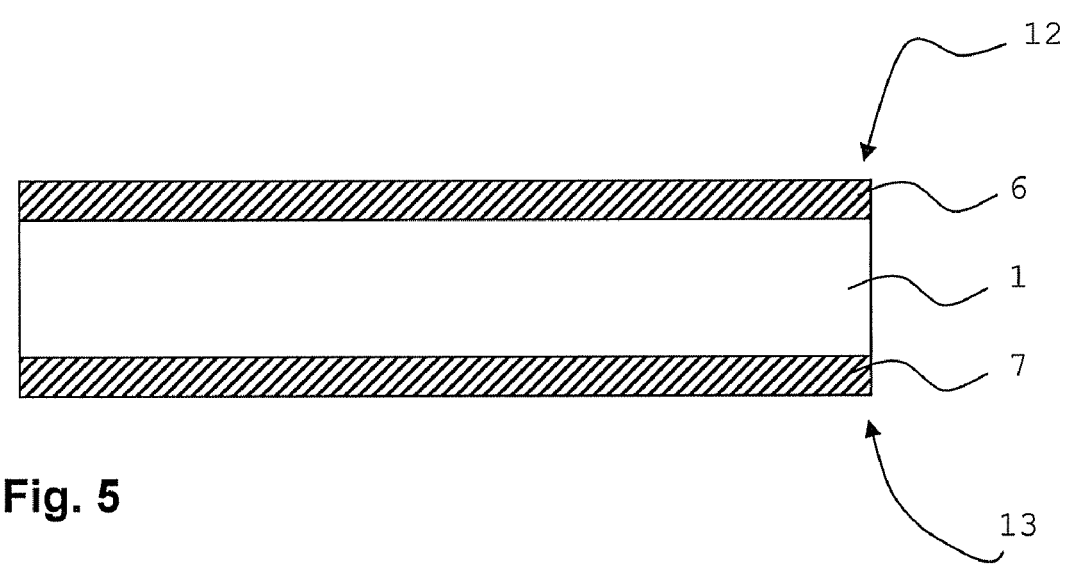
Figure 6:
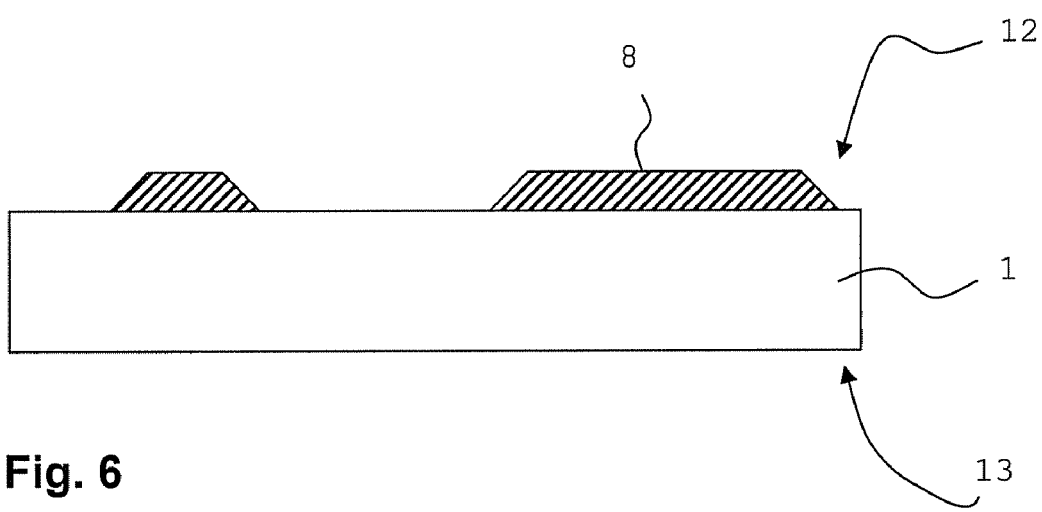

A same result is obtained without using a LOCOS process. To this end, for example the silicon wafer 1 may be thermally oxidized. In this case a continuous front side oxide layer 6 grows on the front side 12, while a continuous rear side oxide layer 7 grows on the rear side 13, cf. FIG. 5. After a patterning process by photolithography followed by a wet etch step (etching the oxide layers on both sides) the wafer 1 according to FIG. 6 is obtained. Also in this case a different layer structure is achieved on the front side and the rear side.

When using an etch process solely acting on the front side, for instance in the form of a plasma etch step, the rear side oxide 7 would not be removed. The layer structure of the front side and rear side would again be different, that is, a patterned oxide layer on the front side and a continuous oxide layer on the rear side 13.

Figure 7:
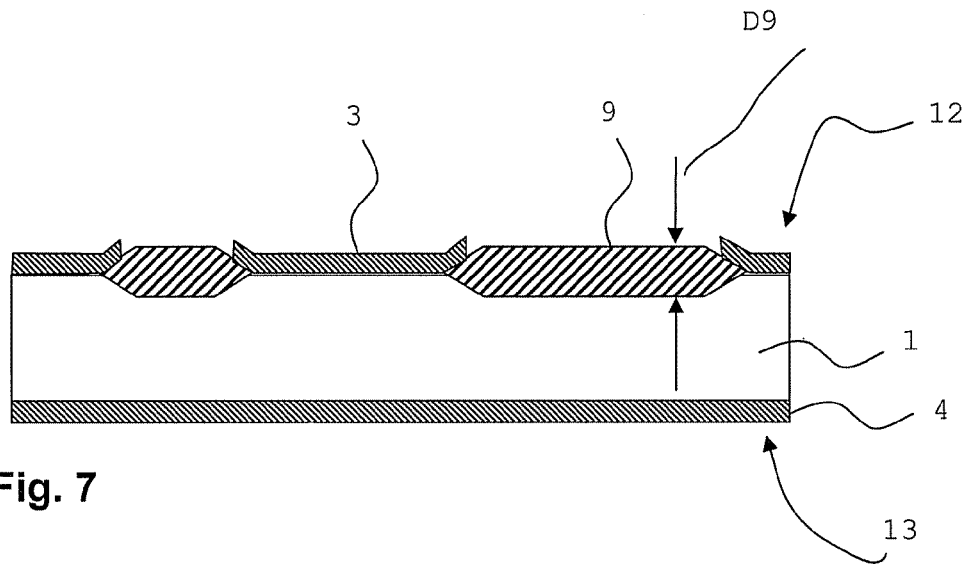
FIGS. 7, 8, 8a are schematic cross-sectional views of semiconductor wafers during various steps for producing, for example, a LOCOS oxide area on a patterned front side including the formation of rear side oxide so as to reduce mechanical stresses, in particular

FIG. 7 illustrates another wafer 1 having a patterned oxidation mask layer 3, for instance a silicon nitride layer, formed on the front side 12 of the wafer, while the rear side 13 is covered by a non-patterned oxidation barrier or mask layer 4, in particular a silicon nitride layer.

Figure 8:
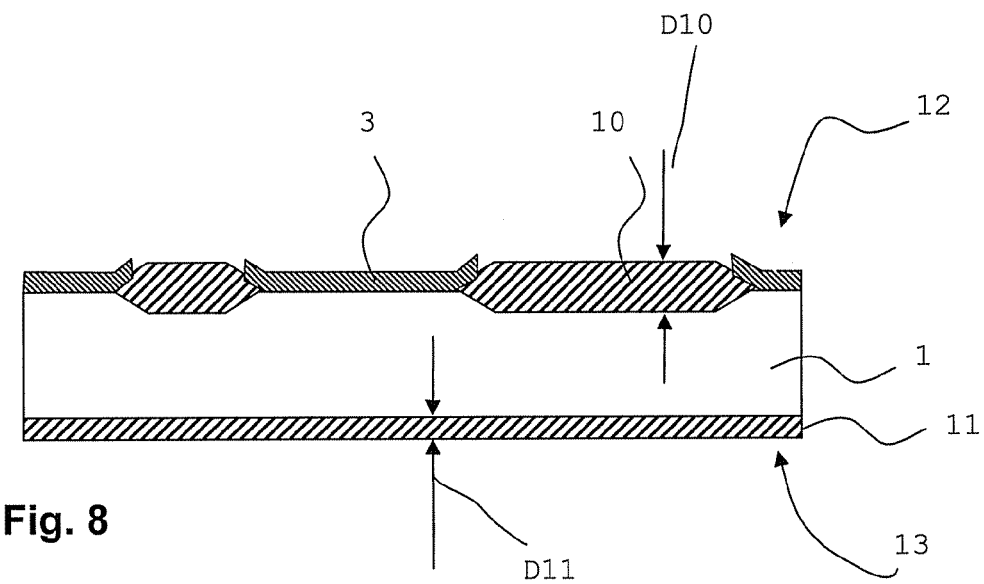

The temporal division of the oxidation processes into two temporal steps (sections) is illustrated in FIGS. 7 and 8.

During the first step of the oxidation process the rear side nitride 4 used as a barrier remains on the rear side 13 of the wafer 1. The oxidation thus takes place on the front side 12 only and the first part of the front side oxide layer 9 is created, cf. FIG. 7.

After a time period T1 the oxidation process is interrupted and the silicon nitride layer 4 is removed from the rear side 13 only by a (specific) etch step. The barrier in the form of the nitride layer 3 at the front side further remains on the wafer, that is, the substrate 1.

Figure 8A:
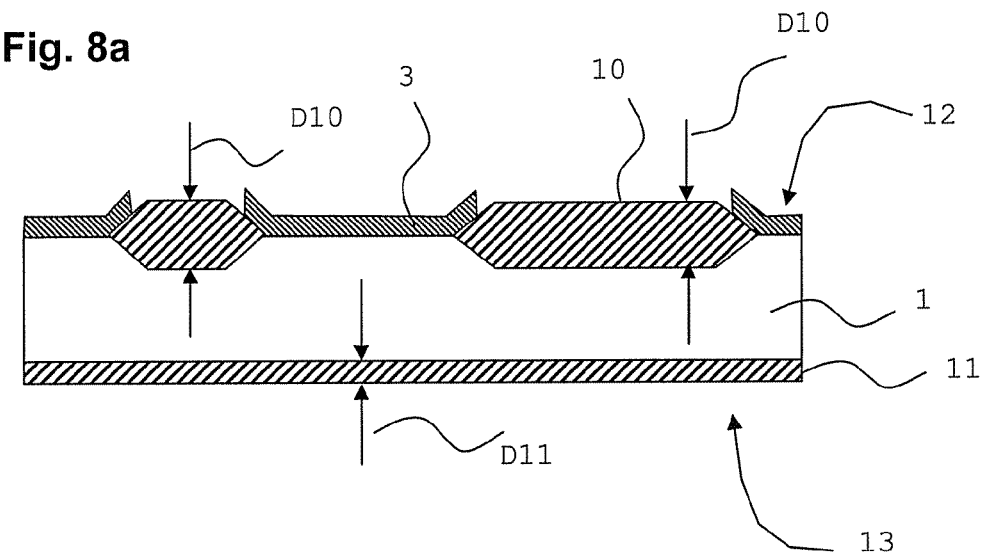

Subsequently the second temporal section of the oxidation takes place for (or during) a time period T2. In this case a further oxidation takes place at the front side, however at a reduced oxidation rate due to the already existing portion of the oxide, that is, a further (thickness) growth of the already existing oxide layer occurs. On the other hand an oxide layer 11 grows on the rear side that has a reduced thickness $D_{11}$ (or D11) compared to the entire front side oxide layer 10, the thickness of which is referred to as $D_{10}$ (or D10) after the complete oxidation process, cf. FIG. 8. In FIG. 8a the growth of the thickness is graphically illustrated more clearly, using the same configuration as in FIG. 8. The two oxide areas in the window of the patterned mask layer 3 are thickened in the same manner relative to the layer 11 located on the opposite side of the substrate.

The time periods T1 and T2 may be adapted to each other according to process and device requirements. In one embodiment the time periods T1 and T2 are adjusted such that an adaptation of the volumes of the front side oxide layer 10 and the volume of the rear side oxide layer 11 is achieved.

T1 and T2 are selected depending on degree of coverage of the front side 12, i.e., the fraction of the area covered by oxide relative to the non-covered area and thus substantially the degree of coverage of the mask layer 3, and depending on the oxide growth rate at both sides 12, 13.

The thickness $D_{10}$ of the front side oxide layer 10 is determined by the time(s) T1 plus T2, while the thickness $D_{11}$ of the rear side oxide layer 11 is determined by the time period T2.

If a certain stress is desired with respect to further process steps or with respect to device characteristics, for instance for creating a mechanical strain in the channel region of transistors for modifying the charge carrier mobility, and the like, the magnitude and the type of stress, that is, tensile stress or compressive stress, may be provided, for instance, on the front side 12 by appropriately selecting in this case the times T1 and T2.

Hence, the examples enable a flexible handling of the adjustment of the remaining stresses caused by the LOCOS technique, wherein in particular these stresses may be minimized.

The invention claimed is:

1. A method of oxidizing a substrate (1), comprising:
providing a substrate (1) having a front side (12) to be patterned and a rear side (13), and determining a degree of oxide coverage for the front side to be patterned;
oxidizing said substrate (1) in two steps, wherein in or during a first step of oxidizing said rear side (13) is covered by an oxidation-hampering layer (4), and in or during a second step of the oxidation said oxidation-hampering layer (4) is not present or is removed such that an increased oxide thickness (D10) is obtained on said front side (12) compared to said rear side (13) during said two steps, and controlling said oxidizing on the basis of the determined degree of coverage, wherein said controlling of oxidizing is taking into account a target thickness of the oxide on the front side (12) to be patterned and said controlling of oxidizing is performed to form substantially equal oxide volumes on the front side (12) and the rear side (13) of said substrate.

2. The method of oxidizing of claim 1, further comprising:
patterning said front side (12) having an oxidation-hampering layer (3) prior to oxidizing said substrate (1).

3. The method of oxidizing of claim 1, further comprising:
patterning said front side (12) after said oxidizing.

4. The method of oxidizing of claim 1,
wherein said oxidation-hampering layer (4) is formed on the rear side prior to the first and second steps and is removed after the first step.

5. The method of oxidizing of claim 1,
wherein said oxidation-hampering layer (4) is formed on the rear side after the first step.

6. The method of oxidizing of claim 1,
wherein said oxidation-hampering layer (4) comprises silicon nitride or is formed of silicon nitride.

7. The method of oxidizing of claim 1,
wherein said substrate (1) is a silicon wafer.

8. A LOCOS oxidation method of silicon wafers for at least reducing mechanical stresses in a silicon wafer patterned on one side only, said mechanical stresses being caused by different layers on a front side and a rear side of the silicon wafer, said method comprising
starting from a silicon wafer (1) comprising a silicon nitride layer (3, 4) on both sides, a silicon nitride layer (3) of a first side (12) being patterned and a silicon nitride layer of a second side (13) of the silicon wafer (1) being non-patterned;
performing the following oxidation in two steps,
in a first step after a first time period (T1) the oxidation that grew an oxide layer having a first thickness (D9) on the first side (12) is interrupted, and removing the continuous nitride layer (4) from the second side (13); and
continuing the oxidation in a second step, wherein said oxide layer on the first side (12) is increased or thickened in a second time period (T2), and further oxide layer (11) growing on the second side (13) with a second thickness (D11), said first and second thicknesses of the oxide layers differing and said first and second time periods being selected such that a volume of the oxide having said increased thickness (D10) is equal to a volume of the further oxide layer (11) having said second thickness (D11) on the second side of the silicon wafer (1).

9. A method of oxidizing a substrate for reducing mechanical stresses caused by different layers on a front side and a rear side of a semiconductor wafer (1) having a patterned oxide layer on a first wafer side (12), said method comprising— starting from an oxidation inhibiting layer (4) formed on a second side (13) of the wafer (1) and performing the following oxidation in two steps, the method further comprising:

in a first step during a first time period (T1) in an oxidation process an oxide layer (6) having a first thickness (D9) is grown on the first side (12) of the semiconductor wafer, followed by interrupting the oxidation process and removing the non-patterned oxidation inhibiting layer (4) from the second side (13) of the wafer (1);

continuing the oxidation process in a second step, wherein in a second time period (T2) the first thickness of the oxide layer on the first side (12) increases to a second thickness (D10) and a further oxide layer (7) having a third thickness (D11) is grown on the second side (13);

the method further comprising selecting first and second time periods such that a volume of a patterned oxide layer or layers (10) having the second thickness (D10) on the first side (12) of the wafer (1) is equal to a volume of the oxide layer (11) on the second side (13) of the wafer (1), and patterning the oxide layer or layers of the first side (12) of the silicon wafer (1) after the end of the oxidation process.

10. The method of claim 9, wherein the oxidation inhibiting layer (4) is a silicon nitride layer.

11. The method of claim 9, wherein the method of oxidizing is a LOCOS oxidation method.

12. The method of claim 9, wherein the method of oxidizing is a LOCOS oxidation method.

13. A method of oxidizing a semiconductor wafer (1) for reducing mechanical stresses in the wafer, the method comprising providing a substrate (1) having a patterned front side or a front side to be patterned as a first side and having a rear side as a second side;

oxidizing the substrate on both sides in two time periods, wherein;

a first oxidation period during which the rear side (13) is covered by an oxidation-hampering layer (4);

a second oxidation period during which the oxidation-hampering layer (4) is not present or is removed;

so as to form or enable the formation of an oxide layer (10) having a first increased or higher oxide thickness (D10) on the first side (12) relative to an oxide thickness (D11) of the oxide layer formed on the rear side (13) of the substrate (1) after the two time periods.

14. The method of claim 13, wherein the oxidation-hampering layer (4) on the second side (13) is a silicon nitride layer.

15. The method of claim 13, wherein an oxidation during a step represents substantially the entire duration (T1, T2) of said oxidation period.

16. The method of claim 13, wherein the method of oxidizing is a LOCOS oxidation method.

17. A semiconductor substrate having an oxide layer formed on both sides, manufactured or manufacturable according to a LOCOS oxidation method for at least reducing a mechanical stress in said substrate patterned on one side only, said mechanical stresses being caused by different layers on a front side and a rear side of the substrate, said method comprising starting from the substrate comprising a silicon nitride layer (3, 4) on both sides, a silicon nitride layer (3) of a first side (12) being patterned and a silicon nitride layer of a second side (13) of the substrate (1) being non-patterned;

performing the following oxidation in two steps, in a first step after a first time period (T1) an oxidation that grew an oxide layer having a first thickness (D9) on the first side (12) is interrupted, and removing the continuous nitride layer (4) from the second side (13); and continuing the oxidation in a second step, wherein said oxide layer on the first side (12) is increased or thickened in a second time period (T2), and an oxide layer (11) growing on the second side (13) with a second thickness (D11), said first and second thicknesses of the oxide layers being different, and said time periods selected such that a volume of the grown oxide having said increased first thickness (D10) is equal to a volume of the second oxide layer (11) having said second thickness (D11) on the second side of the substrate.

18. A semiconductor substrate having an oxide layer formed on both sides, manufactured or manufacturable by a method of oxidizing the substrate for reducing mechanical stresses caused by different layers on a front side and a rear side of the semiconductor substrate having a patterned oxide layer on a first substrate side (12), said method comprising—starting from an oxidation inhibiting layer (4) formed on a second side (13) of the substrate performing the following oxidation in two steps, further comprising in a first step during a first time period an oxide layer having a first thickness (D9) is grown on the first side (12) of the semiconductor substrate, and interrupting the oxidation process and removing the non-patterned oxidation inhibiting layer (4) from the second side (13) of the substrate;

continuing the oxidation process in a second step, wherein in a second time period (T2) the first thickness of the oxide layer on the first side (12) increases to a second thickness (D10) and a third oxide layer (7) having a third thickness (D11) is grown on the second side (13), wherein the third thickness is less than the second thickness and selecting the time periods such that a volume of the patterned oxide layer or layers having the second thickness (D10) on the first side (12) of the wafer (1) is equal to a volume of the third oxide layer (11) on the second side (13) of the wafer (1), and patterning the oxide layer or layers of the first side (12) of the silicon wafer (1) after the end of the oxidation process.

19. A semiconductor substrate having an oxide layer formed on both sides, manufactured or manufacturable according to a method of oxidizing for reducing mechanical stresses in the substrate, comprising the substrate (1) having a patterned front side or a front side to be patterned as a first side and having a rear side as a second side;

oxidizing the substrate on both sides in two time periods during a first oxidation period covering the rear side (13) by an oxidation-hampering layer (4);

a second oxidation period while the oxidation-hampering layer (4) is not present or is removed;

so as to form an oxide layer (10) having a first increased or higher oxide thickness (D10) on the first side (12) relative to an oxide thickness (D11) of the oxide layer formed on the rear side (13) of the substrate (1) after the two time periods.

* * * * *